United States Patent
Wang et al.

(10) Patent No.: US 7,253,764 B2
(45) Date of Patent: Aug. 7, 2007

(54) REFERENCE VOLTAGE GENERATING CIRCUIT

(75) Inventors: Wen-Chi Wang, Yun-Lin Hsien (TW);
Chang-Shun Liu, Taipei (TW);
Chao-Cheng Lee, Hsin-Chu (TW);
Jui-Yuan Tsai, Tai-Nan (TW)

(73) Assignee: Realtek Semiconductor Corp., Science Park, HsInChu (TW)

( * ) Notice: Subject to any disclaimer, the term of this patent is extended or adjusted under 35 U.S.C. 154(b) by 0 days.

(21) Appl. No.: 11/463,014

(22) Filed: Aug. 8, 2006

(65) Prior Publication Data
US 2007/0046523 A1    Mar. 1, 2007

(30) Foreign Application Priority Data
Aug. 30, 2005  (TW) ............................ 94129678 A

(51) Int. Cl.
*H03M 1/12*    (2006.01)
(52) U.S. Cl. ...................... 341/172; 341/143
(58) Field of Classification Search ............ 341/172, 341/143, 150
See application file for complete search history.

(56) References Cited

U.S. PATENT DOCUMENTS

| | | | | |
|---|---|---|---|---|
| 5,691,720 A | * | 11/1997 | Wang et al. | 341/143 |
| 5,703,589 A | * | 12/1997 | Kalthoff et al. | 341/172 |
| 5,990,819 A | * | 11/1999 | Fujimori | 341/150 |
| 6,037,887 A | * | 3/2000 | Wu et al. | 341/143 |
| 6,040,793 A | * | 3/2000 | Ferguson et al. | 341/143 |
| 6,147,522 A | | 11/2000 | Rhode et al. | |

* cited by examiner

*Primary Examiner*—Peguy JeanPierre
(74) *Attorney, Agent, or Firm*—Winston Hsu

(57) ABSTRACT

A reference voltage generating circuit includes: a first capacitor; a second capacitor; a reference voltage sampling capacitor; a first switch for alternatively coupling the second capacitor to a predetermined voltage to allow the second capacitor to sample the predetermined voltage; a second switch for alternatively coupling the second capacitor to the first capacitor to allow the second capacitor to redistribute charges with the first capacitor in order to generate the reference voltage; and a third switch for alternatively coupling the first capacitor to the reference voltage sampling capacitor to allow the reference voltage sampling capacitor to redistribute charges with the first capacitor in order to output the reference voltage.

22 Claims, 9 Drawing Sheets

REFERENCE VOLTAGE GENERATING CIRCUIT

BACKGROUND OF THE INVENTION

1. Field of the Invention

The present invention relates to a reference voltage generating circuit, and more particularly, to a reference voltage generating circuit with high accuracy.

2. Description of the Prior Art

In the fields of digital-to-analog converters (DAC) and analog-to-digital converters (ADC), the allowance range of amplitudes of an input signal is determined according to the relative voltage levels of the positive and negative reference voltages. The noise standard of each circuit in an ADC or DAC is also determined by the allowance range of amplitudes of an input signal. In other words, the larger the relative level of the reference voltage is, the less the design complexity of the noise demands is.

The relative reference voltage levels generated inside the IC, however, are lower than those generated outside the IC. Therefore, in general, the external voltage source $V_{DD}$ and the ground voltage GND are often utilized to generate needed reference voltages.

Please refer to FIG. 1, which is a diagram of a conventional reference voltage generating circuit 100. As shown in FIG. 1, the reference voltage generating circuit 100 includes a capacitor $C_{REF}$, an external capacitor $C_{OFF}$, and two switches SW1 and SW2. The connections between these components are shown in FIG. 1 and a detailed description is thus omitted here. However, in the following disclosure, the operation of the reference voltage generating circuit 100 is illustrated.

In a first stage, the switch SW1 is turned on and the switch SW2 is turned off. The capacitor $C_{REF}$ samples the external voltage source in the first stage. In a second stage, the switch SW2 is turned on and the switch SW1 is turned off. The capacitor $C_{REF}$ redistributes charges with the external capacitor $C_{OFF}$. The first stage and the second stage are alternatively performed such that the capacitor $C_{REF}$ acts as a resistor. Therefore, the reference voltage generating circuit 100 can be regarded as an RC filtering circuit utilized to filter out noises of the external voltage source. This also means a clean reference voltage $V_{REF}$ (i.e. the noise in the reference voltage $V_{REF}$ is substantially eliminated) can be generated.

If the aforementioned reference voltage generating circuit 100 is utilized in the sigma-delta DAC or sigma-delta ADC, for the reference voltage generating circuit 100 has to utilize the same capacitor $C_{REF}$ to perform the sampling operation in the first stage and generate the reference voltage $V_{REF}$ in the second stage, as well as the first stage and the second stage correspond to only half of the sampling period of the input signal of the sigma delta modulator, the operational clock which is originally utilized in the sigma-delta ADC (DAC) does not correspond to the first and second stages. Therefore, two additional operational clocks, which can point out the first stage and the second stage, have to be generated for the reference voltage generating circuit 100. In this way, the complexity of the entire circuit can raise, and a high sampling frequency cannot be utilized.

SUMMARY OF THE INVENTION

It is therefore one of the primary objectives of the claimed invention to provide a reference voltage generating circuit utilizing a capacitor to sample an external voltage source in a first stage and utilizing another capacitor to generate a reference voltage, to solve the above-mentioned problem.

According to an exemplary embodiment of the claimed invention, a reference voltage generating circuit for generating a reference voltage according to a predetermined voltage is disclosed. The reference voltage generating circuit comprises: a first capacitor; a second capacitor; a reference voltage sampling capacitor; a first switch, for alternatively coupling the second capacitor to the predetermined voltage, wherein the first switch couples the second capacitor to the predetermined voltage in a first stage such that the second capacitor samples the predetermined voltage; a second switch, for alternatively coupling the second capacitor to the first capacitor, wherein the second switch couples the second capacitor to the first capacitor in a second stage in order to generate the reference voltage; and a third switch, for alternatively coupling the first capacitor to the reference voltage sampling capacitor, wherein the third switch couples the first capacitor to the reference voltage sampling capacitor in the first stage such that the reference voltage sampling capacitor redistributes charges with the first capacitor to generate the reference voltage.

According to another exemplary embodiment of the claimed invention, a sigma-delta analog-to-digital converter (ADC) is disclosed. The sigma-delta analog-to-digital converter (ADC) comprises: a reference voltage generating circuit, for generating a reference voltage according to a predetermined voltage and a sigma delta modulator, for receiving the reference voltage from the reference voltage sampling capacitor in the first stage and receiving an analog signal in the second stage in order to generate a corresponding digital signal according to the analog signal and the reference voltage. The reference voltage generating comprises: a first capacitor; a second capacitor; a reference voltage sampling capacitor; a first switch, for alternatively coupling the second capacitor to the predetermined voltage, wherein the first switch couples the second capacitor to the predetermined voltage in a first stage such that the second capacitor samples the predetermined voltage; a second switch, for alternatively coupling the second capacitor to the first capacitor, wherein the second switch couples the second capacitor to the first capacitor in the second stage such that the second capacitor redistributes charges with the first capacitor in order to generate the reference voltage; and a third switch, for alternatively coupling the first capacitor to the reference voltage sampling capacitor, wherein the third switch couples the first capacitor to the reference voltage sampling capacitor in the first stage such that the reference voltage sampling capacitor redistributes charges with the first capacitor to generate the reference voltage.

According to another exemplary embodiment of the claimed invention, a sigma delta digital-to-analog converter (DAC) is disclosed. The sigma delta digital-to-analog converter (DAC) comprises: a reference voltage generating circuit, for receiving a predetermined voltage and filtering the predetermined voltage to generate a reference voltage, and a sigma delta modulator, for receiving the predetermined voltage from the reference voltage sampling capacitor according to a digital signal in the first stage to generate an analog signal. The reference voltage generating circuit comprises: a first capacitor; a second capacitor; a reference voltage sampling capacitor; a first switch, for alternatively coupling the second capacitor to the predetermined voltage, wherein the first switch couples the second capacitor to the predetermined voltage in a first stage such that the second capacitor samples the predetermined voltage and breaks the electrical connection between the second capacitor and the predetermined voltage in a second stage; a second switch, for alternatively coupling the second capacitor to the first capacitor, wherein the second switch couples the second capacitor to the first capacitor in the second stage such that the second capacitor redistributes charges with the first capacitor in order to generate the reference voltage and breaks the electrical connection between the first capacitor and the second capacitor in the first stage; a third switch, for alternatively coupling the first capacitor to the reference voltage sampling capacitor, wherein the third switch couples the first capacitor to the reference voltage sampling capacitor in the first stage such that the reference voltage sampling capacitor redistributes charges with the first capacitor to generate the reference voltage and breaks the electrical connection between the first capacitor and the reference voltage sampling capacitor in the second stage.

According to another exemplary embodiment of the claimed invention, a reference voltage generating method for receiving a predetermined voltage and filtering the predetermined voltage to generate a reference voltage is disclosed. The reference voltage generating method comprises: utilizing a first capacitor to sample the predetermined voltage in a first stage; coupling the first capacitor to a second capacitor in a second stage such that the first capacitor redistributes charges stored in the first capacitor with the second capacitor to generate the reference voltage; and coupling a reference voltage sampling capacitor to the second capacitor in the first stage to obtain the reference voltage from the second capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
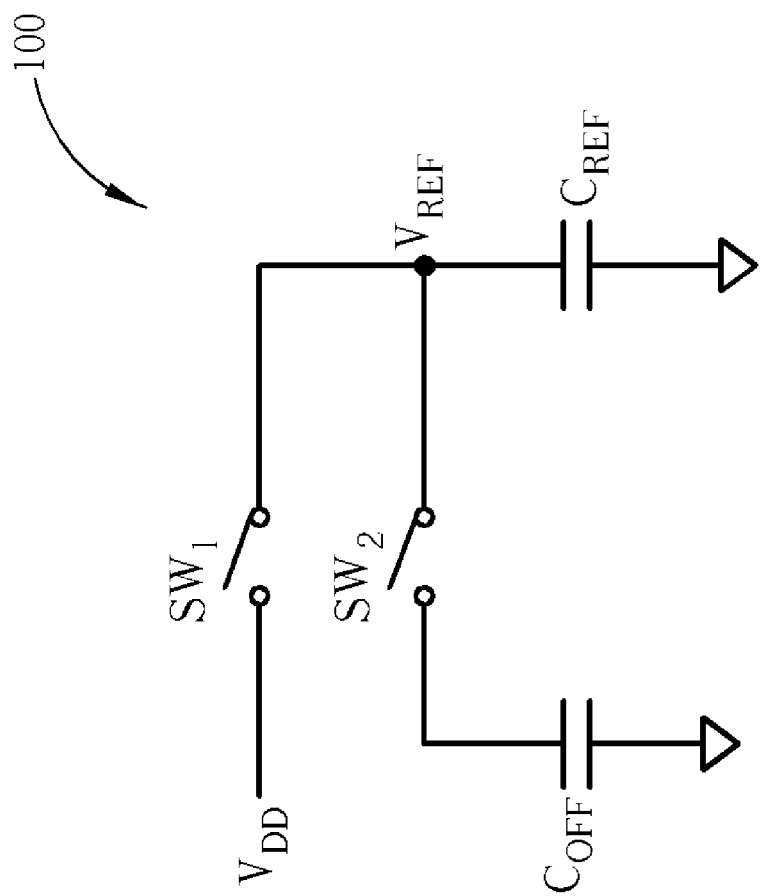
FIG. 1 is a diagram of a conventional reference voltage generating circuit.
Figure 2:
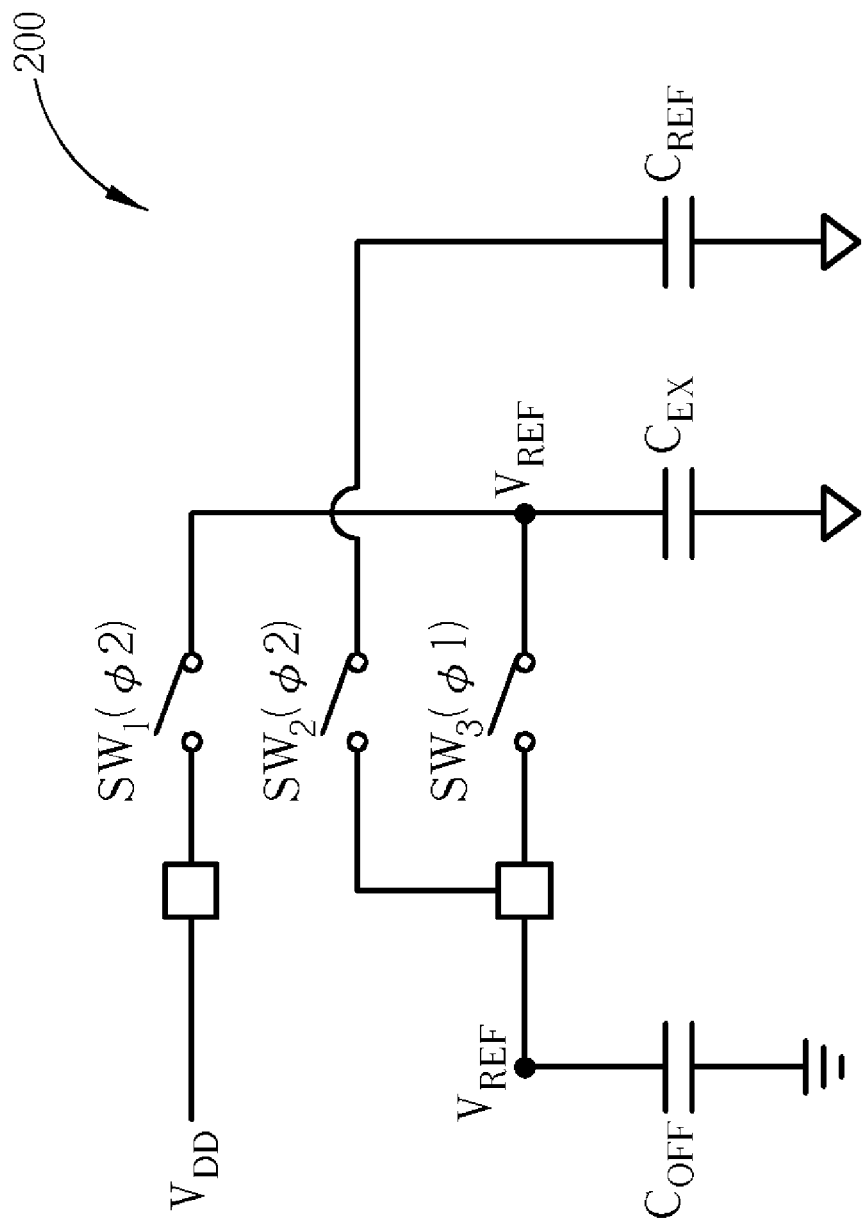
FIG. 2 is a diagram of a reference voltage generating circuit according to the present invention.

Please refer to FIG. 2, which is a diagram of a reference voltage generating circuit 200 according to the present invention. As shown in FIG. 2, the reference voltage generating circuit 200 includes two capacitors $C_{EX}$ and $C_{REF}$, an external (off-chip) capacitor $C_{OFF}$, and three switches SW1, SW2, and SW3. The connections between these components are shown in FIG. 2 and a detailed description is thus omitted here. Please note, each switch SW1, SW2, and SW3 is marked by a corresponding operational clock.

Figure 3:
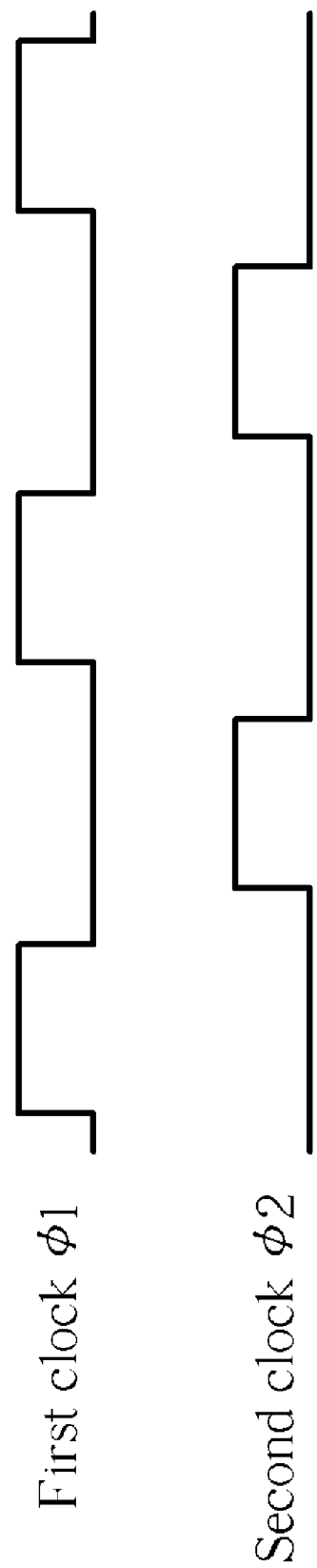
FIG. 3 is a diagram of operational clocks utilized in the reference voltage generating circuit shown in FIG. 2 according to the present invention.

Please refer to FIG. 3, which is a diagram of operational clocks utilized in the reference voltage generating circuit 200 shown in FIG. 2 according to the present invention. When the reference voltage generating circuit 200 lies in a first stage, meaning that the first clock φ1 is at a high voltage level, the switch SW3 is turned on, and the switches SW1 and SW2 are turned off. The capacitor $C_{EX}$ redistributes charges with the external capacitor $C_{OFF}$ such that a needed reference voltage $V_{REF}$ is generated. When the reference voltage generating circuit 200 lies in a second stage, meaning that the second clock φ2 is at a high voltage level, the switches SW1 and SW2 are turned on, and the switch SW3 is turned off. The capacitor $C_{EX}$ samples the external voltage source $V_{DD}$, and store charges in the capacitor $C_{EX}$. In addition, in the second stage, the reference voltage $V_{REF}$ generated in the previous stage is outputted because the switch SW2 is turned on.

The theorems of the reference voltage generating circuit 200 shown in FIG. 2 and the conventional voltage generating circuit 100 are quite similar. The capacitor is frequently switched such that the capacitor acts as a resistor. Therefore, an RC filtering circuit is formed and can be utilized to filter the external voltage source $V_{DD}$ such that the clean reference voltage $V_{REF}$ is generated.

Figure 4:
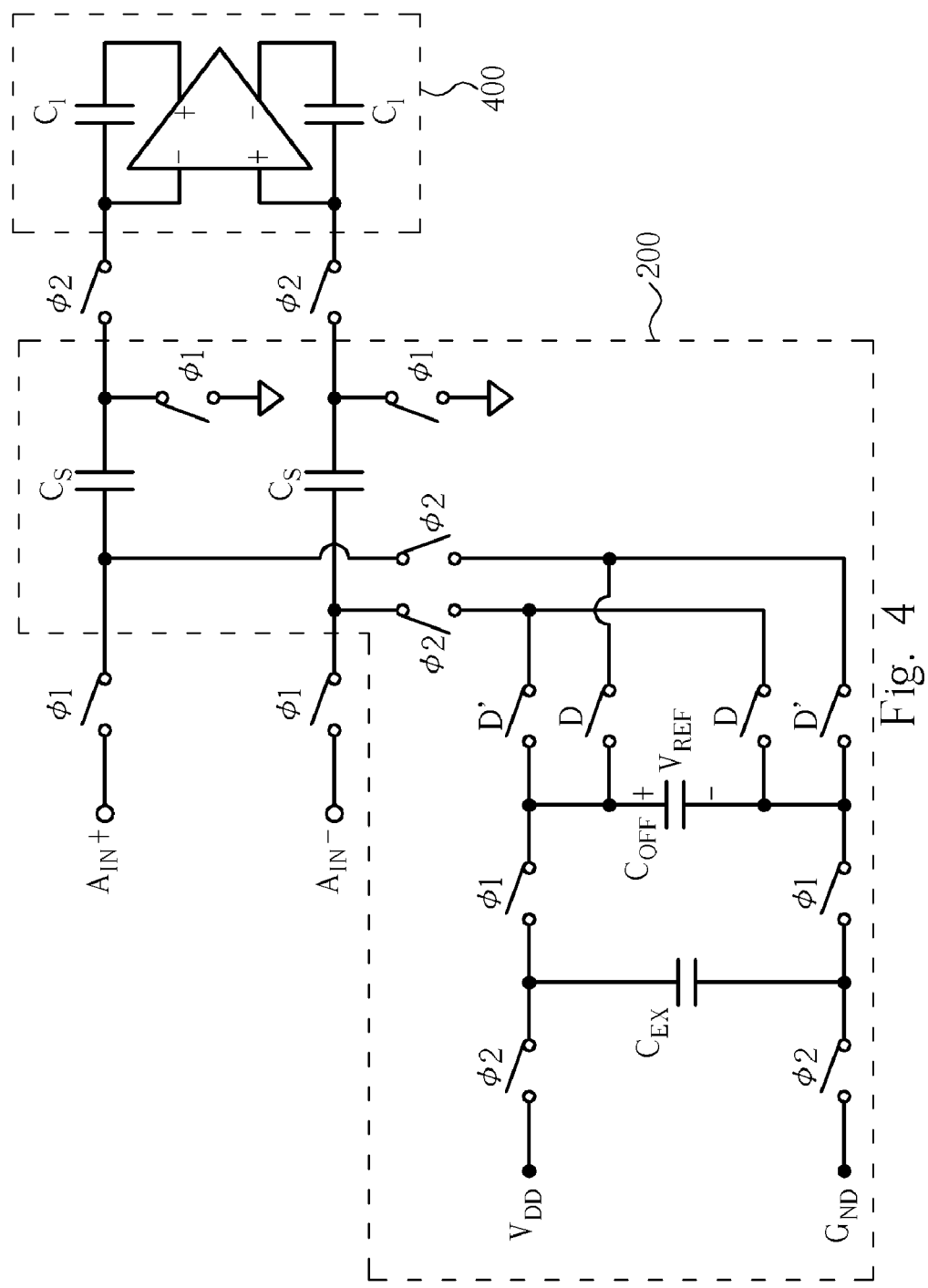
FIG. 4 is a diagram illustrating the reference voltage generating circuit shown in FIG. 2 being utilized in a sigma-delta ADC.

Please refer to FIG. 4, which is a diagram illustrating the reference voltage generating circuit 200 shown in FIG. 2 being utilized in a sigma-delta ADC. Please note, because the sigma-delta ADC is well known, those skilled in the art can easily understand the circuit structure of other components. Only the reference voltage generating circuit 200 and an integrator 400 are shown in FIG. 4, and other components (such as an equalizer, feedback circuit) are omitted here. As is shown in this embodiment, the reference voltage generating circuit 200 utilizes the sampling capacitor Cs, which is originally inside the sigma-delta modulator, as the abovementioned capacitor $C_{REF}$ to obtain the reference voltage $V_{REF}$.

Please note that each switch shown in FIG. 4 is also labeled by a corresponding operational clock. To illustrate simply, the corresponding clock of each switch is the same as the operational clocks shown in FIG. 3.

Figure 5:
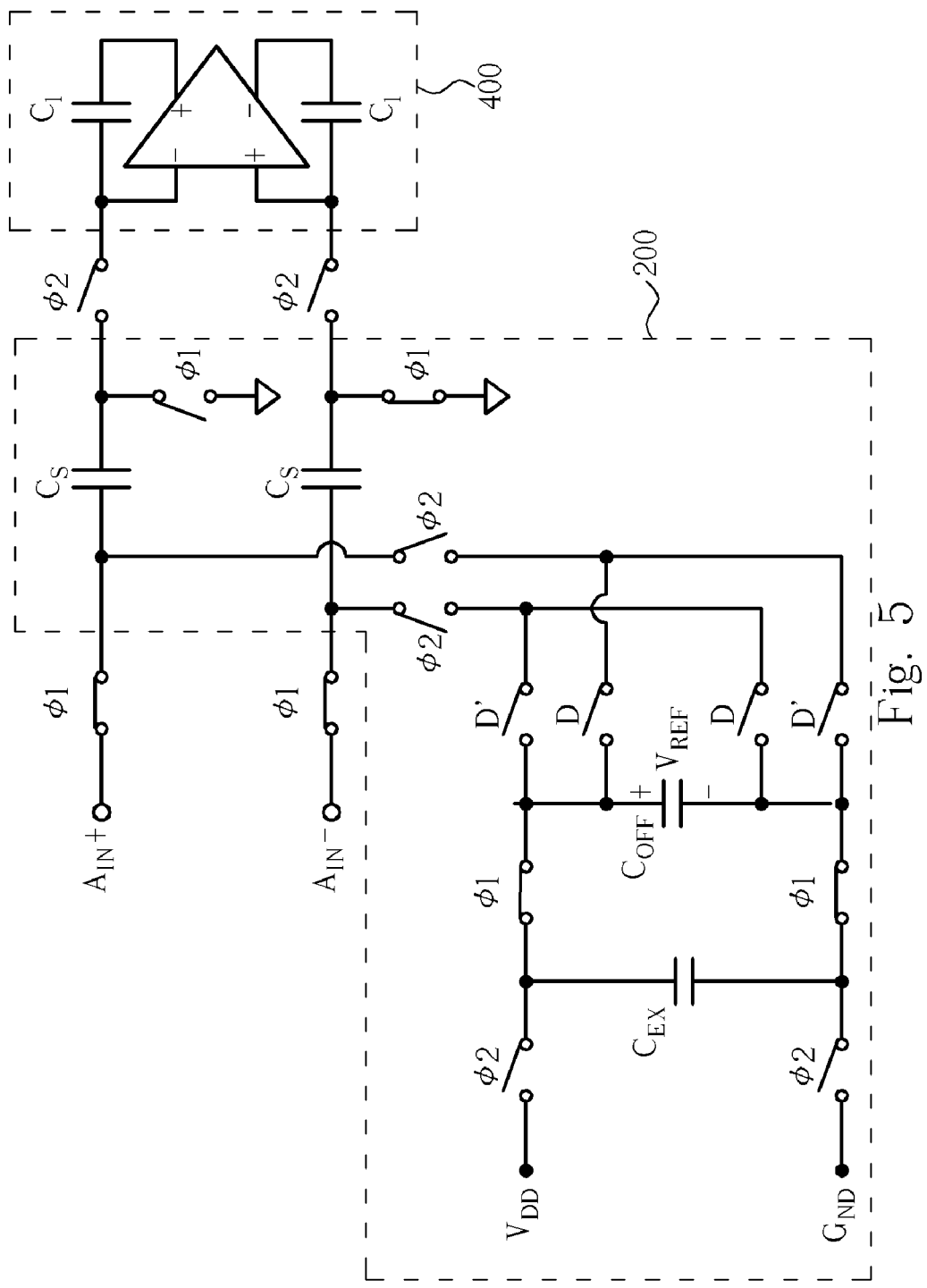
FIG. 5 is a diagram illustrating that the circuit shown in FIG. 4 is in a first stage.

FIG. 5 is a diagram illustrating when the circuit shown in FIG. 4 is in the first stage, meaning that the first clock φ1 shown in FIG. 3 is at a high voltage level. As shown in FIG. 5, the sampling capacitor Cs starts to sample an input analog signal $A_{in}$. In the reference voltage generating circuit 200, the capacitor $C_{EX}$ redistributes charges of the previous stage with the external capacitor $C_{OFF}$ such that the reference voltage $V_{REF}$ is generated.

Figure 6:
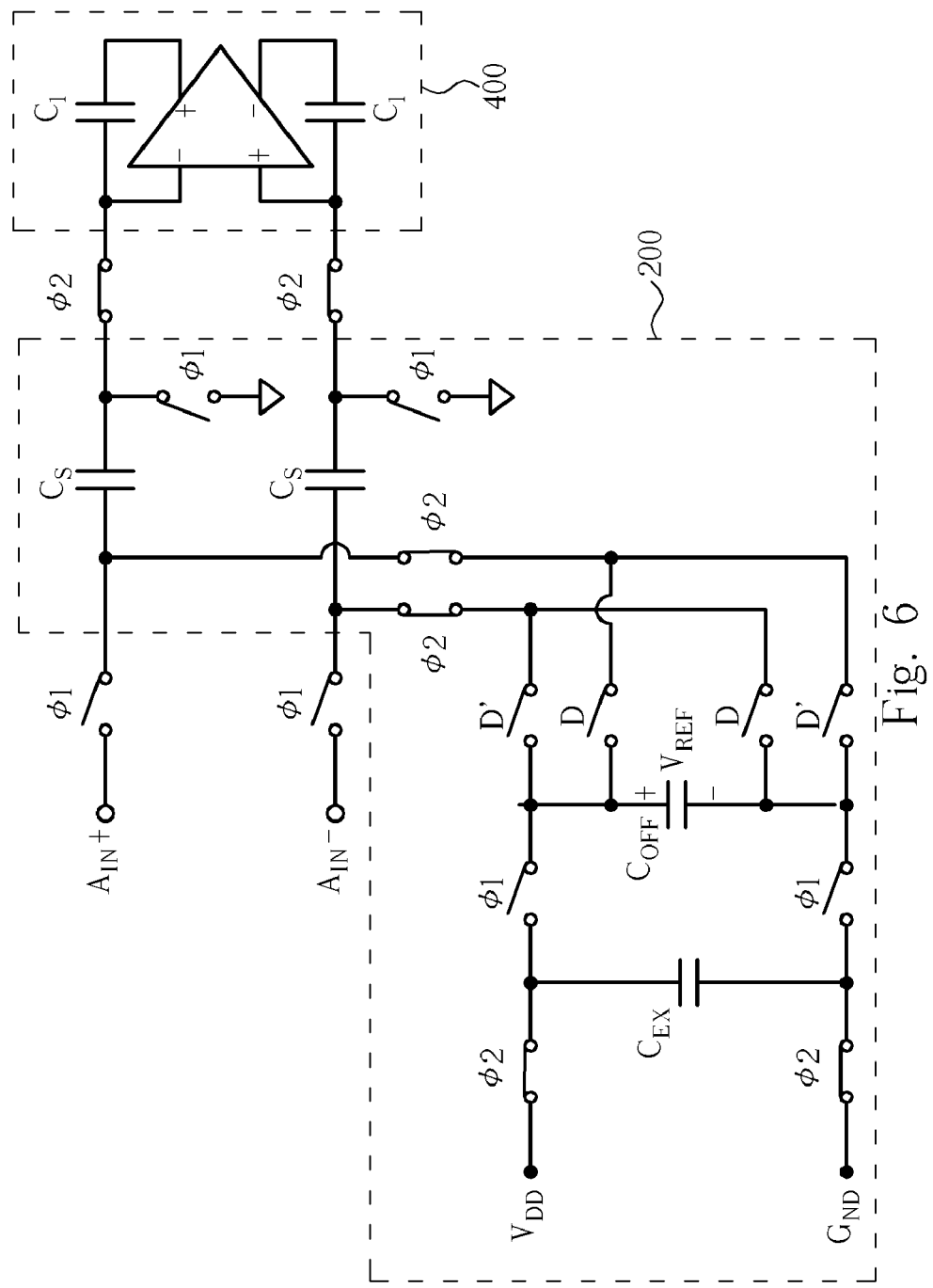
FIG. 6 is a diagram illustrating that the circuit shown in FIG. 4 is in a second stage.

FIG. 6 is a diagram illustrating when the circuit shown in FIG. 4 is in the second stage, meaning that the first clock φ2 shown in FIG. 3 is at a high voltage level. The polarization of the reference voltage $V_{REF}$ is determined according to the feedback digital signal D (D') outputted by the sigma-delta ADC. Furthermore, the input analog signal $A_{in}$ sampled in the first stage and the feedback reference voltage are inputted into the integrator 400 through the sampling capacitor Cs. In the reference voltage generating circuit 200, the sampling capacitor Cs obtains the reference voltage $V_{REF}$, which is originally stored inside the external capacitor $C_{OFF}$, and the capacitor $C_{EX}$ simultaneously samples the external voltage source $V_{DD}$ or the ground voltage $G_{ND}$ for the next first stage. Therefore, the entire sigma-delta ADC can be operated correctly to generate needed digital signals.

Figure 7:
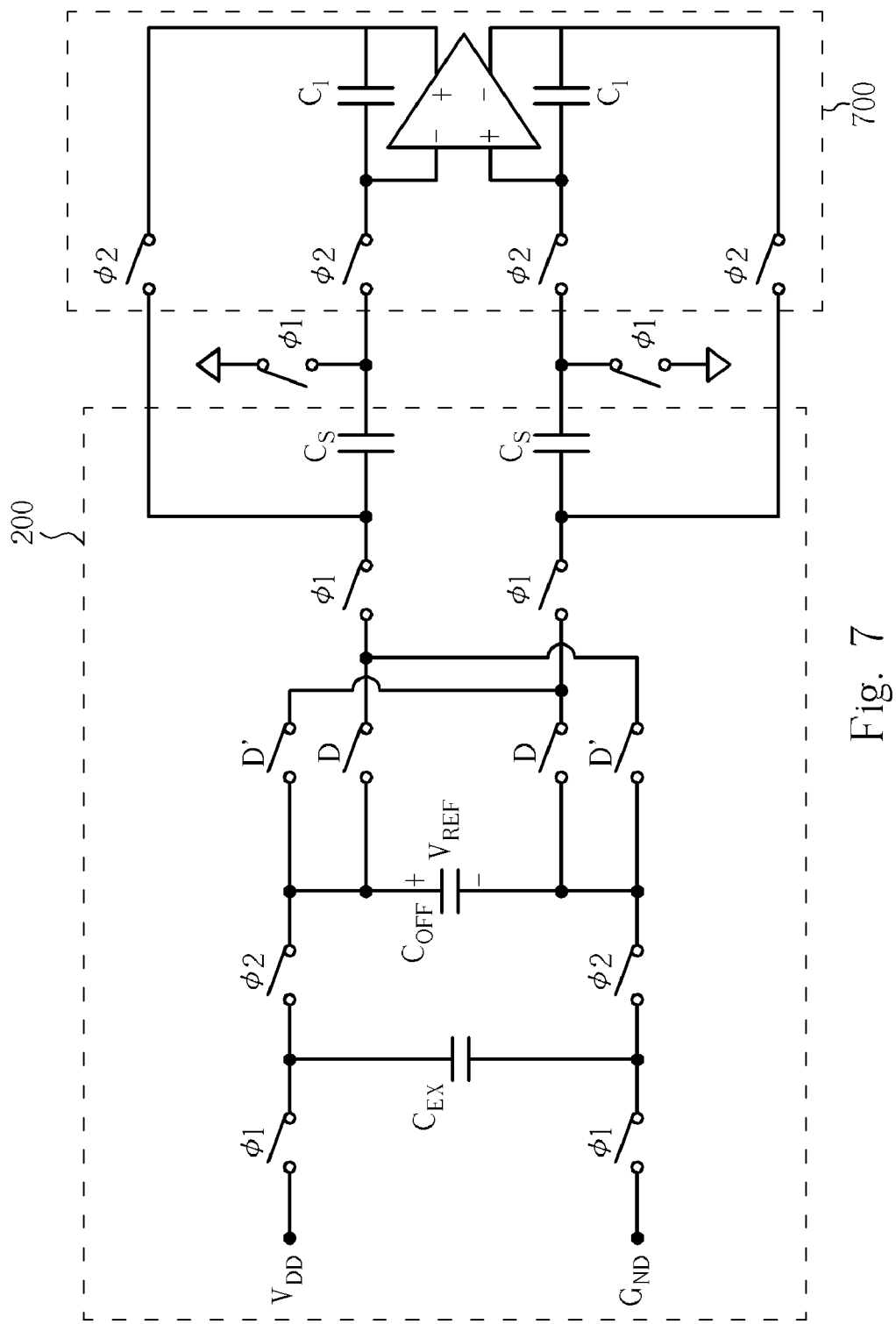
FIG. 7 is a diagram illustrating the reference voltage generating circuit utilized in a sigma-delta DAC according to the present invention.

Please refer to FIG. 7, which is a diagram illustrating the reference voltage generating circuit 200 utilized in a sigma-delta DAC according to the present invention. Please note, as the sigma-delta DAC is well known, those skilled in the art can easily understand the circuit structure of other components. Only the reference voltage generating circuit 200 and an integrator 700 are shown in FIG. 7, and other components, such as an equalizer or a feedback circuit, are omitted here. Furthermore, as is shown in this embodiment, the reference voltage generating circuit 200 also utilizes the sampling capacitor Cs which is originally inside the sigma-delta modulator as the above-mentioned capacitor $C_{REF}$ to obtain the reference voltage $V_{REF}$.

Please note that each switch shown in FIG. 7 is labeled by a corresponding operational clock. To illustrate simply, the corresponding clock of each switch is the same as the operational clocks shown in FIG. 3.

Figure 8:
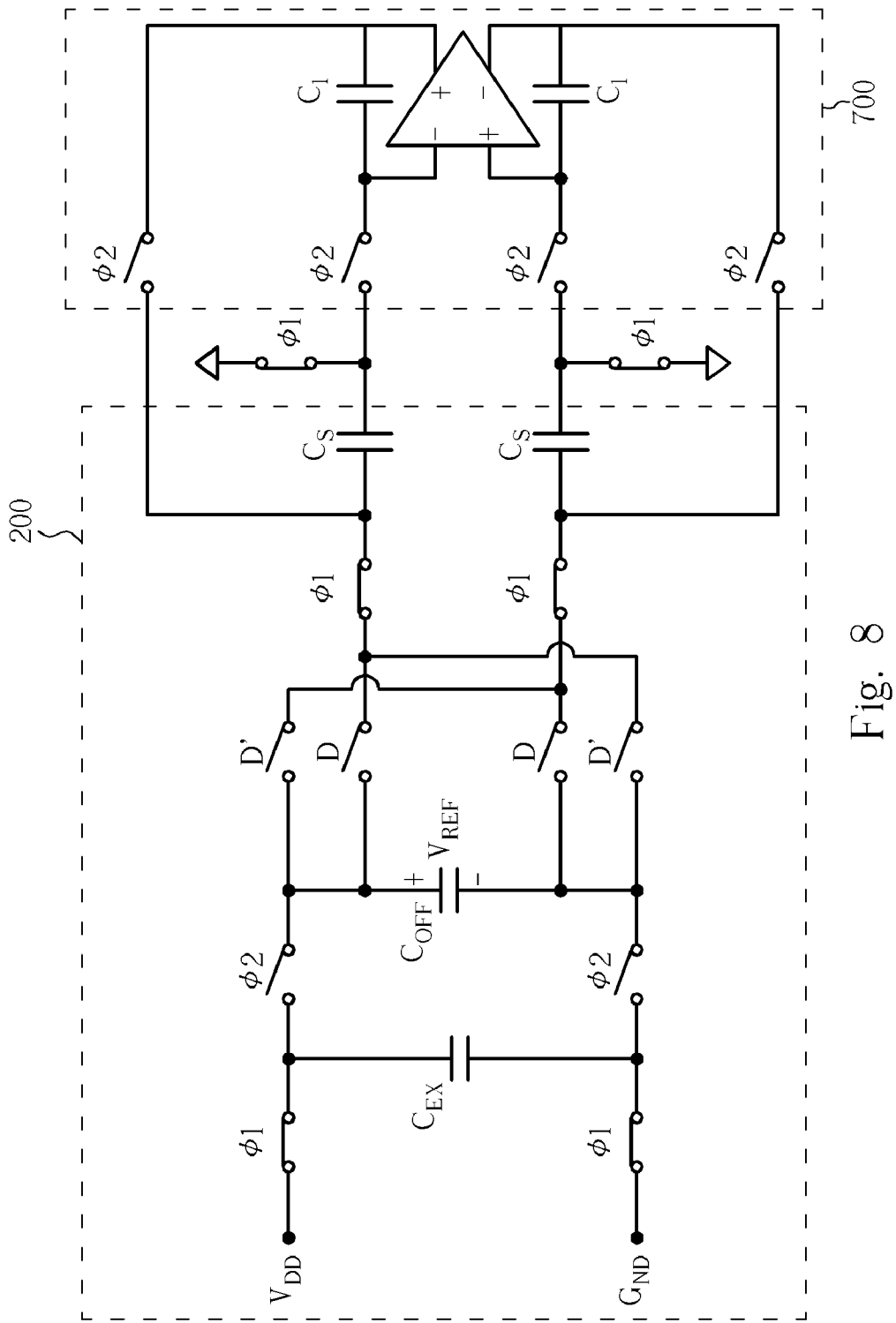
FIG. 8 is a diagram illustrating that the circuit shown in FIG. 7 is in a first stage.

FIG. 8 is a diagram illustrating when the circuit shown in FIG. 7 is in a first stage, meaning that the first clock $\phi 1$ shown in FIG. 3 is at a high voltage level. As shown in FIG. 8, the sampling capacitor Cs samples the reference voltage $V_{REF}$, which is generated by the external capacitor $C_{OFF}$ in the previously stage, according to an input digital signal D (D'). In the reference voltage generating circuit 200, the capacitor $C_{EX}$ starts to sample the external voltage source $V_{DD}$ or the ground voltage $G_{ND}$ for the next stage.

Figure 9:
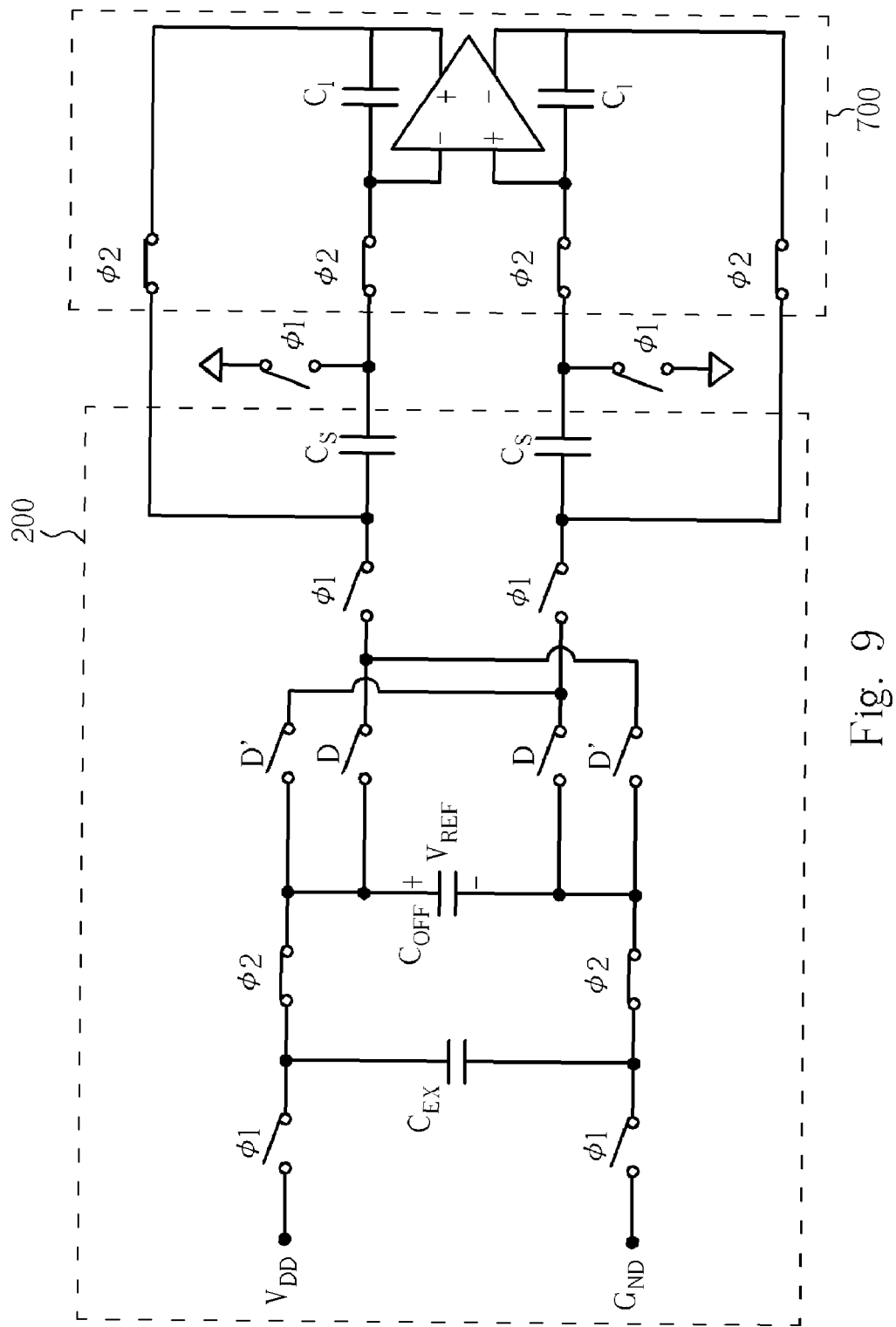
FIG. 9 is a diagram illustrating that the circuit shown in FIG. 7 is in a second stage.

FIG. 9 is a diagram illustrating when the circuit shown in FIG. 7 is in the second stage, meaning that the second clock $\phi 2$ is at a high voltage level. At this time, the sampling capacitor Cs inputs the sampled reference voltage into the integrator 700. In the reference voltage generating circuit 200, the capacitor $C_{EX}$ redistributes charges with the external capacitor $C_{OFF}$ such that the reference voltage $V_{REF}$ is generated across the two ends of the external capacitor $C_{OFF}$. Therefore, when the entire circuit is back to the first stage, the sampling capacitor Cs can sample the reference voltage $V_{REF}$ again. The entire sigma-delta DAC can thus operate correctly to generate needed analog signals.

Please note that the circuits shown in FIG. 4 and FIG. 7 are differential circuits. However, the present invention is not limited to be utilized in the differential circuits. In addition, the present invention can be also utilized in single-ended circuits, which also obeys the spirit of the present invention.

With a capacitor $C_{EX}$, the reference voltage generating circuit of the present invention does not need to utilize a same capacitor to generate the reference voltage and sample the external voltage source. The reference voltage generating circuit of the present invention can utilize the original operational clock to work. The conventional two additional operational clocks are eliminated. Therefore, the present invention can reduce the circuit complexity and can be utilized in a high frequency circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reference voltage generating circuit for generating a reference voltage according to a predetermined voltage, the reference voltage generating circuit comprising:
    a first capacitor;
    a second capacitor;
    a reference voltage sampling capacitor;
    a first switch, for alternatively coupling the second capacitor to the predetermined voltage, wherein the first switch couples the second capacitor to the predetermined voltage in a first stage such that the second capacitor samples the predetermined voltage;
    a second switch, for alternatively coupling the second capacitor to the first capacitor, wherein the second switch couples the second capacitor to the first capacitor in a second stage in order to generate the reference voltage; and
    a third switch, for alternatively coupling the first capacitor to the reference voltage sampling capacitor, wherein the third switch couples the first capacitor to the reference voltage sampling capacitor in the first stage such that the reference voltage sampling capacitor redistributes charges with the first capacitor to generate the reference voltage.

2. The reference voltage generating circuit of claim 1, wherein the first switch and the third switch are both controlled by a same clock.

3. The reference voltage generating circuit of claim 1, wherein the reference voltage generating circuit receives the predetermined voltage and filters the predetermined voltage to output the reference voltage.

4. The reference voltage generating circuit of claim 1, wherein the first switch breaks the electrical connection between the second capacitor and the predetermined voltage in the second stage.

5. The reference voltage generating circuit of claim 1, wherein the second capacitor redistributes charges with the first capacitor to generate the reference voltage.

6. The reference voltage generating circuit of claim 1, wherein the second switch breaks the electrical connection between the first capacitor and the second capacitor in the first stage.

7. The reference voltage generating circuit of claim 1, wherein the third switch breaks the electrical connection between the first capacitor and the reference voltage sampling capacitor in the second stage.

8. A sigma-delta analog-to-digital converter (ADC) comprising:
    a reference voltage generating circuit, for generating a reference voltage according to a predetermined voltage, the reference voltage generating circuit comprising:
        a first capacitor;
        a second capacitor;
        a reference voltage sampling capacitor;
        a first switch, for alternatively coupling the second capacitor to the predetermined voltage, wherein the first switch couples the second capacitor to the predetermined voltage in a first stage such that the second capacitor samples the predetermined voltage;
        a second switch, for alternatively coupling the second capacitor to the first capacitor, wherein the second switch couples the second capacitor to the first capacitor in the second stage such that the second capacitor redistributes charges with the first capacitor in order to generate the reference voltage; and
        a third switch, for alternatively coupling the first capacitor to the reference voltage sampling capacitor, wherein the third switch couples the first capacitor to the reference voltage sampling capacitor in the first stage such that the reference voltage sampling capacitor redistributes charges with the first capacitor to generate the reference voltage; and
    a sigma delta modulator, for receiving the reference voltage from the reference voltage sampling capacitor in the first stage and receiving an analog signal in the second stage in order to generate a corresponding digital signal according to the analog signal and the reference voltage.

9. The sigma-delta analog-to-digital converter (ADC) of claim 8, wherein the first switch and the third switch are both controlled by a first clock.

10. The sigma-delta analog-to-digital converter (ADC) of claim 9, wherein the second switch is controlled by a second clock.

11. The sigma-delta analog-to-digital converter (ADC) of claim 10, wherein the sigma delta modulator is controlled by the first clock and the second clock.

12. The sigma-delta analog-to-digital converter (ADC) of claim 8, wherein the reference voltage generating circuit receives the predetermined voltage and filters the predetermined voltage in order to generate the reference voltage.

13. The sigma-delta analog-to-digital converter (ADC) of claim 8, wherein the first switch breaks the electrical connection between the second capacitor and the predetermined voltage in the second stage.

14. The sigma-delta analog-to-digital converter (ADC) of claim 8, wherein the second capacitor redistributes charges with the first capacitor to generate the reference voltage.

15. The sigma-delta analog-to-digital converter (ADC) of claim 8, wherein the second switch breaks the electrical connection between the first capacitor and the second capacitor in the first stage.

16. The sigma-delta analog-to-digital converter (ADC) of claim 8, wherein the third switch breaks the electrical connection between the first capacitor and the reference voltage sampling capacitor in the second stage.

17. A sigma delta digital-to-analog converter (DAC) comprising:
a reference voltage generating circuit, for receiving a predetermined voltage and filtering the predetermined voltage to generate a reference voltage, the reference voltage generating circuit comprising:
a first capacitor;
a second capacitor;
a reference voltage sampling capacitor;
a first switch, for alternatively coupling the second capacitor to the predetermined voltage, wherein the first switch couples the second capacitor to the predetermined voltage in a first stage such that the second capacitor samples the predetermined voltage and breaks the electrical connection between the second capacitor and the predetermined voltage in a second stage;
a second switch, for alternatively coupling the second capacitor to the first capacitor, wherein the second switch couples the second capacitor to the first capacitor in the second stage such that the second capacitor redistributes charges with the first capacitor in order to generate the reference voltage and breaks the electrical connection between the first capacitor and the second capacitor in the first stage; and
a third switch, for alternatively coupling the first capacitor to the reference voltage sampling capacitor, wherein the third switch couples the first capacitor to the reference voltage sampling capacitor in the first stage such that the reference voltage sampling capacitor redistributes charges with the first capacitor to generate the reference voltage and breaks the electrical connection between the first capacitor and the reference voltage sampling capacitor in the second stage; and
a sigma delta modulator, for receiving the reference voltage from the reference voltage sampling capacitor according to a digital signal in the first stage to generate an analog signal.

18. The sigma delta digital-to-analog converter (DAC) of claim 17, wherein the first switch and the third switch are both controlled by a first clock, the second switch is controlled by a second clock, and the sigma-delta modulator is simultaneously controlled by the first clock and the second clock.

19. A reference voltage generating method for receiving a predetermined voltage and filtering the predetermined voltage to generate a reference voltage, the reference voltage generating method comprising:
utilizing a first capacitor to sample the predetermined voltage in a first stage;
coupling the first capacitor to a second capacitor in a second stage such that the first capacitor redistributes charges stored in the first capacitor with the second capacitor to generate the reference voltage; and
coupling a reference voltage sampling capacitor to the second capacitor in the first stage to obtain the reference voltage from the second capacitor.

20. The reference voltage generating method of claim 19 being utilized in a sigma-delta digital-to-analog converter (DAC).

21. The reference voltage generating method of claim 19 being utilized in a sigma-delta analog-to-digital converter (ADC).

22. The reference voltage generating method of claim 19, wherein the step of coupling the first capacitor to the second capacitor in the second stage to redistribute the charges stored in the first capacitor further comprises:
filtering out AC noises of the predetermined voltage.

* * * * *